United States Patent
Chung et al.

(10) Patent No.: US 10,284,216 B1
(45) Date of Patent: May 7, 2019

(54) CALIBRATION CIRCUIT AND CALIBRATION METHOD FOR SUCCESSIVE APPROXIMATION REGISTER ANALOG-TO-DIGITAL CONVERTER

(71) Applicant: REALTEK SEMICONDUCTOR CORPORATION, Hsinchu (TW)

(72) Inventors: Kuo-Sheng Chung, Taipei (TW); Shih-Hsiung Huang, Miaoli County (TW); Jie-Fan Lai, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/182,866

(22) Filed: Nov. 7, 2018

(30) Foreign Application Priority Data

Feb. 2, 2018 (TW) .............................. 107103742 A

(51) Int. Cl.
*H03M 1/80* (2006.01)
*H03M 1/10* (2006.01)
*H03M 1/38* (2006.01)
*H03M 1/40* (2006.01)
*H03M 1/46* (2006.01)

(52) U.S. Cl.
CPC ........... *H03M 1/1009* (2013.01); *H03M 1/38* (2013.01); *H03M 1/40* (2013.01); *H03M 1/462* (2013.01); *H03M 1/804* (2013.01)

(58) Field of Classification Search
CPC ...... H03M 1/1009; H03M 1/001; H03M 1/38; H03M 1/40; H03M 1/462; H03M 1/125; H03M 1/1255; H03M 1/804
USPC .......................... 341/118, 120, 155, 163, 172
See application file for complete search history.

(56) References Cited

U.S. PATENT DOCUMENTS

| | | | |
|---|---|---|---|
| 8,754,798 B2 * | 6/2014 | Lin ......................... | H03M 1/38 341/118 |
| 8,786,483 B1 | 7/2014 | Thompson et al. | |
| 9,614,539 B2 * | 4/2017 | Tang ...................... | H03M 1/125 |
| 9,621,179 B1 * | 4/2017 | Maulik ................. | H03M 1/466 |

(Continued)

OTHER PUBLICATIONS

Allen Waters et al., IEEE paper:"Analysis of Metastability Errors in Conventional, LSB-First, and Asynchronous SAR ADCs", Nov. 2016, vol. 63, No. 11.

(Continued)

*Primary Examiner* — Khai M Nguyen
(74) *Attorney, Agent, or Firm* — WPAT, PC

(57) ABSTRACT

A calibration circuit and calibration method for a successive approximation register analog-to-digital converter (SAR ADC) are disclosed. The SAR ADC includes a comparator and generates a digital code. The calibration method includes the following steps: (a) creating a voltage difference between two inputs of the comparator, with the absolute value of the voltage difference being smaller than or equal to the absolute value of the voltage corresponding to the least significant bit (LSB) of the digital code; (b) updating a count value according to whether a timer of the SAR ADC issues a time-out signal, the timer issuing the time-out signal after a delay time has elapsed; (c) repeating steps (a) through (b) a predetermined number of times; (d) calculating a probability based on the predetermined number of times and the count value; and (e) adjusting the delay time according to the probability.

14 Claims, 7 Drawing Sheets

(56) References Cited

U.S. PATENT DOCUMENTS

2018/0013442 A1  1/2018  Fogleman et al.

OTHER PUBLICATIONS

Taiwan Intellectual Property Office, "Office Action", dated Aug. 14, 2018, Taiwan. OA letter of counterpart TW application(appl. No. 107103742) Summary of the TW OA letter: Reference 1 (U.S. Pat. No. 8,786,483 B1) and reference 2 (US 2018/0013442 A1) render claim 6 obvious.

* cited by examiner

CALIBRATION CIRCUIT AND CALIBRATION METHOD FOR SUCCESSIVE APPROXIMATION REGISTER ANALOG-TO-DIGITAL CONVERTER

BACKGROUND OF THE INVENTION

1. Field of the Invention

The present invention generally relates to a successive approximation register analog-to-digital converter (hereinafter referred to as SAR ADC), and, more particularly, to a calibration circuit and a calibration method for the timer of the SAR ADC.

2. Description of Related Art

FIG. 1 is a partial circuit diagram of a conventional SAR ADC. The SAR ADC 100 includes a comparator 110, an exclusive-OR gate (XOR gate) 120, a timer 130, and a D flip-flop (DFF) 140. The comparator 110 needs to perform multiple comparison operations so that the SAR ADC 100 can generate a digital code. For example, an N-bit SAR ADC 100 requires the comparator 110 to perform N comparison operations to produce an N-bit digital code. As shown in FIG. 1, in a certain comparison operation, the voltage difference between the inputs of the comparator 110 is Vin, and the output voltages of the comparator 110 are outp and outn. A correct comparison operation means that after the comparison operations is completed, one of the output voltages outp and outn is HIGH while the other is LOW, which renders the output of the XOR gate 120 HIGH. When the comparator 110 starts the comparison operation according to the start signal S, the timer 130 also starts timing according to the start signal S. After starting timing, the timer 130 issues a time-out signal Tout (i.e., time out occurs) after a delay time has passed (i.e., after the delay time has elapsed or expiry of the delay time). During the delay time, when the output of the XOR gate 120 changes from LOW to HIGH (meaning that the comparator 110 changes from a reset state to finishing the comparison operation), the D flip-flop 140 correspondingly outputs a signal VLD of HIGH level, indicating that the comparator 110 has successfully completed one comparison operation. On the contrary, when the output of the XOR gate 120 does not change from LOW to HIGH during the delay time, the D flip-flop 140 correspondingly outputs a signal VLD of LOW level, indicating that the comparator 110 fails to successfully complete the comparison operation.

The comparison time that the comparator 110 needs is associated with the input voltage difference Vin. FIG. 2 shows a relationship between the comparison time that a comparator needs and the input voltage difference. In general, the smaller the input voltage difference Vin is, the longer the comparison time that the comparator 110 needs. As shown in FIG. 2, when the input voltage difference is the voltage of one least significant bit (LSB) (in this case, 0.24 mV), the comparison time is approximately 160 ps. If the comparison time that the comparator 110 needs is less than 160 ps, it implies that the voltage difference inputted to the comparator 110 is greater than 0.24 mV; if, on the contrary, the comparison time that the comparator 110 needs is greater than 160 ps, it implies that the voltage difference inputted to the comparator 110 is smaller than 0.24 mV.

FIGS. 3A and 3B show waveforms with respect to the conversion time of the SAR ADC. As shown in FIG. 3A, assuming that the SAR ADC 100 requires a time period of Treq to generate an N-bit digital code, an additional buffer time interval Tbuf is reserved in advance in practical practices to give the SAR ADC 100 a total allowed time period Tcon for generating a digital code. Unfortunately, the SAR ADC 100 may encounter a situation where the comparator 110 consumes too much comparison time in a certain comparison operation (e.g., as shown in FIG. 3B, the comparison operation corresponding to bit bi consumes an unusually long time); thus, the SAR ADC 100 fails to generate a digital code within the allowed time period Tcon. The timer 130 is utilized to prevent the buffer time interval Tbuf from being used up, that is, to prevent the metastability error of the comparator 110 from occurring. Thus, the timer 130 may also be referred to as a metastability detector or a proximity detector. A properly designed delay time of the timer 130 ensures stable operation of the SAR ADC 100. However, the difference or mismatch in the aspect of circuit configuration between the comparator 110 and the timer 130 tends to cause the dependence between the comparison time of the comparator 110 and the delay time of the timer 130 to be susceptible to the process, voltage, and temperature. Therefore, the timer 130 needs to be calibrated to ensure the stability of the SAR ADC 100.

SUMMARY OF THE INVENTION

In view of the issues of the prior art, an object of the present invention is to provide a calibration circuit and a calibration method for an SAR ADC to improve the stability of the SAR ADC, so as to make an improvement to the prior art.

A method for calibrating a successive approximation register analog-to-digital converter (SAR ADC) is provided. Before the SAR ADC generates a digital code, a comparator of the SAR ADC performs N comparison operations, and a final comparison operation of the N comparison operations corresponds to a least significant bit (LSB) of the digital code. The calibration method includes steps of: (a) inputting a voltage to the SAR ADC; (b) turning off a timer of the SAR ADC in the first N−1 comparison operations of the N comparison operations, wherein the timer issues a time-out signal after a delay time has passed; (c) turning on the timer during the final comparison operation of the N comparison operations; (d) repeating steps (a) through (c) a predetermined number of times, and, meanwhile, updating a count value according to whether the timer issues the time-out signal; (e) calculating a probability according to the predetermined number of times and the count value; and (f) adjusting the delay time according to the probability.

A method for calibrating a successive approximation register analog-to-digital converter (SAR ADC) is provided. The SAR ADC includes a comparator and generates a digital code. The calibration method includes steps of: (a) creating a voltage difference between two inputs of the comparator, wherein an absolute value of the voltage difference is smaller than or equal to an absolute value of a voltage corresponding to a least significant bit (LSB) of the digital code; (b) updating a count value according to whether a timer of the SAR ADCs issues a time-out signal, wherein the timer issues the time-out signal after a delay time has passed; (c) repeating steps (a) through (b) a predetermined number of times; (d) calculating a probability according to the predetermined number of times and the count value; and (e) adjusting the delay time according to the probability.

In the present invention, the calibration circuit and the calibration method for the SAR ADC can calibrate the mismatch between the comparison time and the delay time caused by process, voltage, and temperature variations. The calibration circuit and the calibration method for the SAR ADC uses an easy-to-implement and efficient method to calibrate the timer of the SAR ADC, and the calibrated SAR ADC has a significant improvement in performance (for example, significantly reducing bit error rate (BER)).

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes calibration circuits and calibration methods for SAR ADCs. On account of that some or all elements of the SAR ADC could be known, the detail of such elements is omitted provided that such detail has little to do with the features of this disclosure and this omission nowhere dissatisfies the specification and enablement requirements. Some or all of the processes of the calibration methods for SAR ADCs may be implemented by software and/or firmware and can be performed by the calibration circuits for SAR ADCs. A person having ordinary skill in the art can choose components or steps equivalent to those described in this specification to carry out the present invention, which means that the scope of this invention is not limited to the embodiments in the specification.

For an N-bit SAR ADC, in the first N−1 comparison operations, the voltage difference between the inputs of the comparator is difficult to predict, but in the final comparison operation (i.e., the $N^{th}$ comparison operation, corresponding to the least significant bit (LSB) of the N-bit digital code), it is very likely that the voltage difference between the inputs of the comparator is within $\pm V_{LSB}$ (the voltage $V_{LSB}$ being the voltage corresponding to the LSB of the SAR ADC). Therefore, this characteristic can be employed to calibrate the timer of the SAR ADC.

Figure 4:
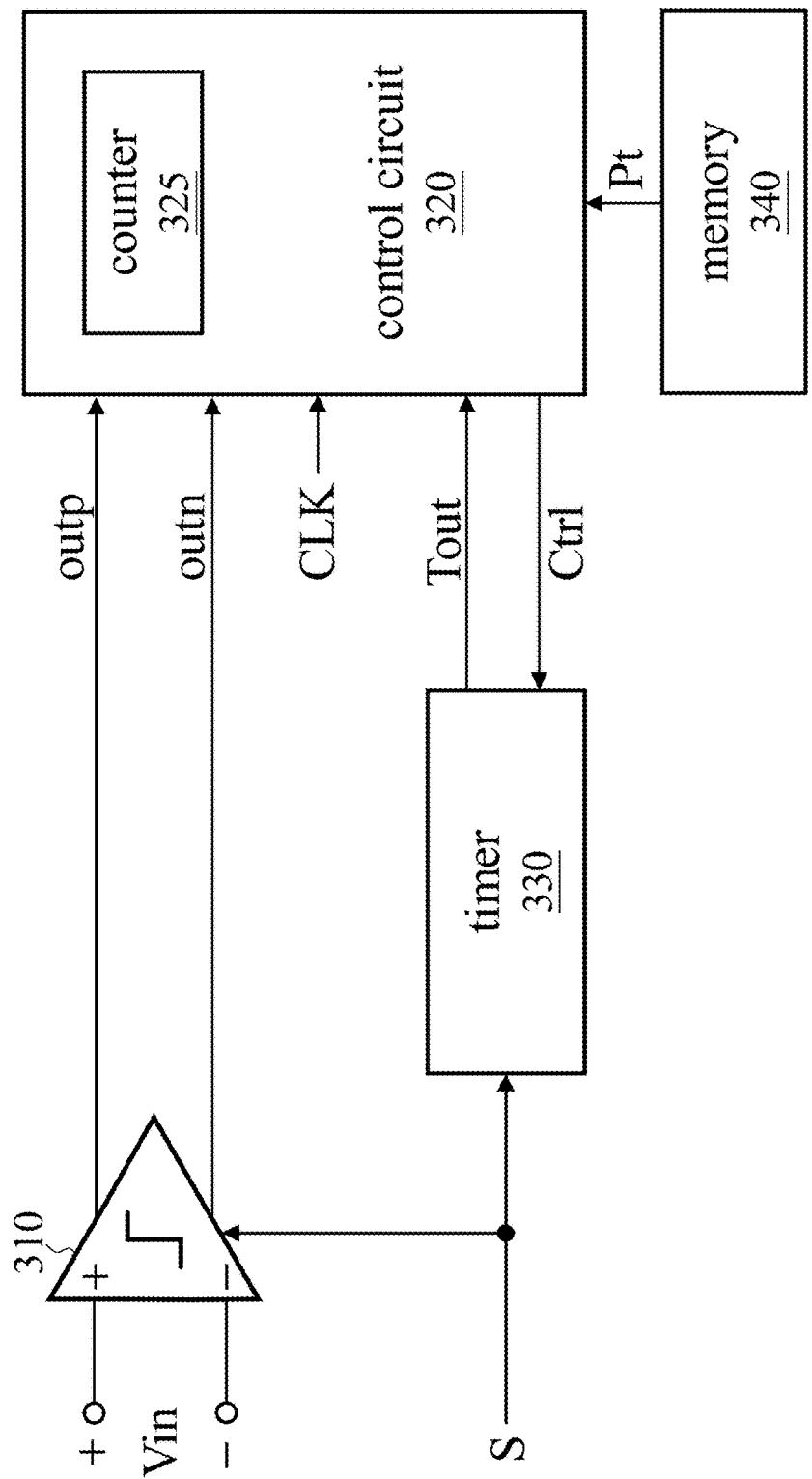
FIG. 4 illustrates a functional block diagram of a timer calibration circuit according to an embodiment of the present invention.
Figure 5:
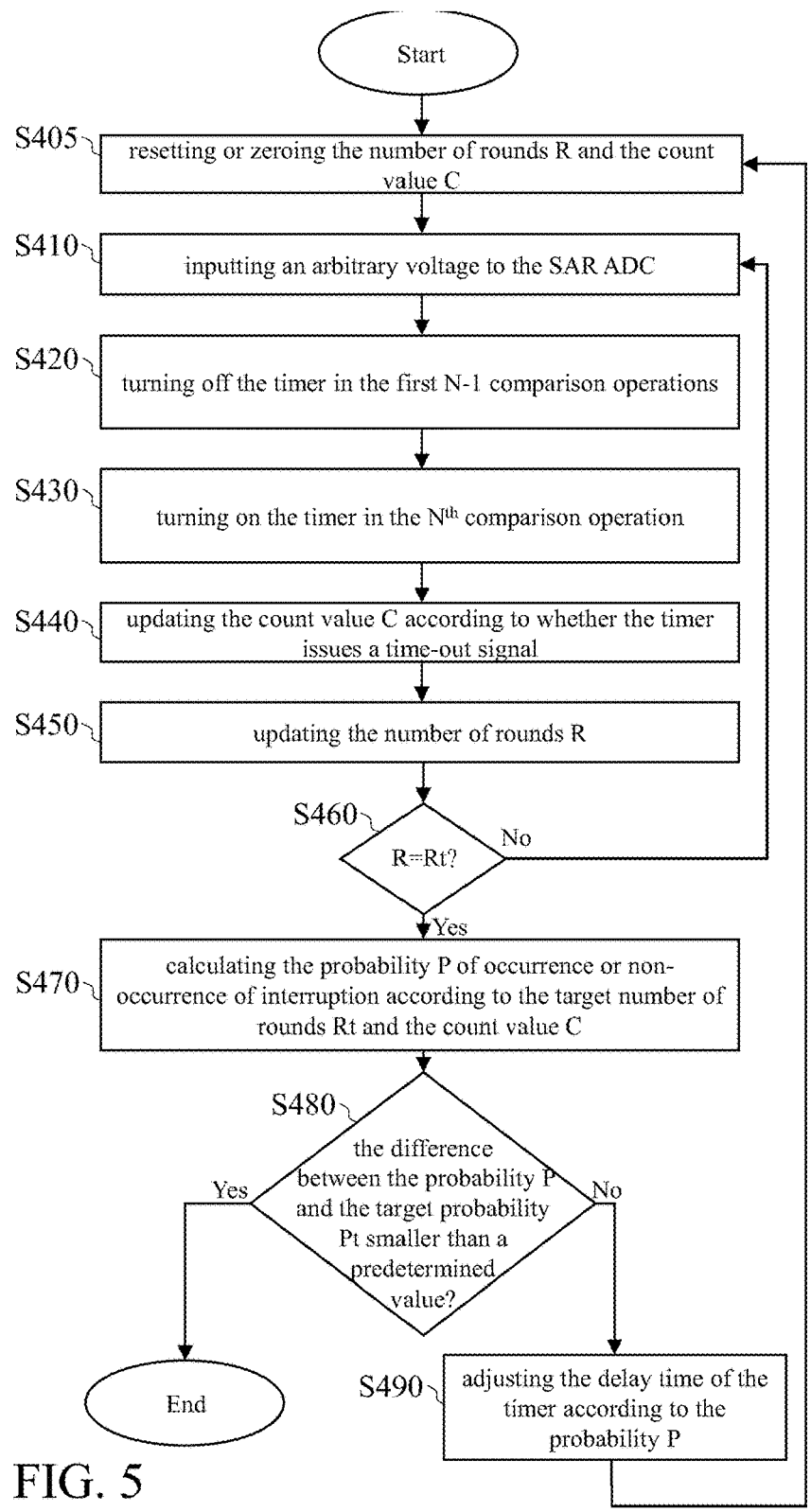
FIG. 5 illustrates a flowchart of a timer calibration method according to an embodiment of the present invention.

FIG. 4 is a functional block diagram of a timer calibration circuit according to an embodiment of the present invention. The calibration circuit includes a control circuit 320 and a memory 340. The control circuit 320 is coupled to the comparator 310, the timer 330, and the memory 340. The control circuit 320 includes a counter 325. The memory 340 stores a target probability Pt. FIG. 5 is a flowchart of a timer calibration method according to an embodiment of the present invention. Reference is made to both FIG. 4 and FIG. 5. At the start of the calibration, the control circuit 320 first resets the counter 325 (i.e., zeros the number of rounds R and the count value C of the counter 325) (step S405). Next, the control circuit 320 controls the SAR ADC to receive an arbitrary voltage (step S410). It is assumed here that SAR ADC is N bits; therefore, in the first N−1 comparison operations, the control circuit 320 controls the timer 330 to be turned off (step S420), and, in the $N^{th}$ comparison operation, the control circuit 320 controls the timer 330 to be turned on (step S430). For a synchronous SAR ADC, the control circuit 320 can determine the start time of the $N^{th}$ comparison operation according to the system clock CLK of the SAR ADC. For an asynchronous SAR ADC, the control circuit 320 can determine the start time of the $N^{th}$ comparison operation according to the output voltages outp and outn of the comparator 310. More specifically, the period of the comparison operation for the synchronous SAR ADC (i.e., the period of the system clock CLK) is fixed, whereas the asynchronous SAR ADC does not have a fixed period for comparison operations. For the asynchronous SAR ADC, the output voltages outp and outn being of different levels indicates the completion of a comparison operation.

In step S440, the counter 325 updates the count value C according to whether the timer 330 issues a time-out signal. This count value C can be the number of times the time-out signal is issued (i.e., occurrence of time out) or the number of times the time-out signal is not issued (i.e., non-occurrence of time out). The issuance of the time-out signal indicates that the comparison time of the $N^{th}$ comparison operation of the comparator 310 is greater than the delay time of the timer 330; on the contrary, no issuance of the time-out signal indicates that the comparison time of the $N^{th}$ comparison operation of the comparator 310 is smaller than the delay time of the timer 330. Steps S410 to S450 are regarded as one round. When one round ends, the counter 325 updates the number of rounds R (e.g., increases the number of rounds R by one) (step S450), and then the control circuit 320 determines whether the number of rounds R has reached a target number of rounds Rt (step S460). The target number of rounds Rt can be determined by the tester.

The control circuit 320 repeats steps S410 to S450 until the number of rounds R is equal to the target number of rounds Rt (step S460 is affirmative). The control circuit 320 then calculates the probability P of occurrence or non-occurrence of time out (i.e., issuance or non-issuance of the time-out signal) according to the target number of rounds Rt and the count value C (step S470), and determines whether the probability P falls within a predetermined range (i.e., determining whether the difference between the probability P and the target probability Pt is smaller than a predetermined value) (step S480). If step S480 is affirmative, the calibration process is ended; if not, the control circuit 320 issues a control signal Ctrl according to the probability P to adjust the delay time of the timer 330 (step S490). After step S490 is completed, the calibration process returns to step S405.

The foregoing target probability Pt may be a range. If the probability P falls within the range, then step S480 is affirmative, which means that the delay time of the timer 330 does not need to be adjusted.

If the count value C corresponds to the number of times the time-out signal is issued, the probability P corresponding to occurrence of time out is P=C/Rt, and the probability P corresponding to non-occurrence of time out is P=(Rt-C)/Rt. If, on the other hand, the count value C corresponds to the number of times the time-out signal is not issued, the probability P corresponding to occurrence of time out is P=(Rt-C)/Rt, and the probability P corresponding to non-occurrence of time out is P=C/Rt. Depending on the definition of the probability P, step S490 has different adjustment mechanisms. When the probability P corresponds to occurrence of time out, the control circuit 320 adjusts the delay time of the timer 330 according to the following mechanism: (1) when the probability P is greater than the target probability Pt, the control circuit 320 increases the delay time of the timer 330; and (2) when the probability P is smaller than the target probability Pt, the control circuit 320 decreases the delay time of the timer 330. When the probability P corresponds to non-occurrence of time out, the control circuit 320 adjusts the delay time of the timer 330 according to the following mechanism: (1) when the probability P is greater than the target probability Pt, the control circuit 320 decreases the delay time of the timer 330; and (2) when the probability P is smaller than the target probability Pt, the control circuit 320 increases the delay time of the timer 330.

The timer 330, for example, can generate the time-out signal Tout by charging a capacitor, in which case the delay time is related to the magnitude of the charging current and the size of the capacitor. The control circuit 320 can turn off the timer 330 by not charging the capacitor in step S420 and can adjust the delay time by changing the charging current and the capacitance in step S490. Since the comparator 310 and the timer 330 are well-known components, and their implementation variations are well known to those of ordinary skill in the art, the details are thus omitted for brevity.

In some embodiments, at the start of the calibration process, the delay time is set to maximum (e.g., the maximum allowed). In this case, step S405 to step S490 may be performed multiple times, in which the probability P obtained in the first execution of step S470 is equal to or close to zero provided that the probability P corresponds to occurrence of time out or equal to or close to one provided that the probability P corresponds to non-occurrence of time out. The control circuit 320 decreases the delay time of the timer 330 in a monotonic manner each time step S490 is performed.

In other embodiments, at the start of the calibration process, the delay time is set to minimum (e.g., the minimum allowed). In this case, step S405 to step S490 may be performed multiple times, in which the probability P obtained in the first execution of step S470 is equal to or close to one provided that the probability P corresponds to occurrence of time out or equal to or close to zero provided that the probability P corresponds to non-occurrence of time out. The control circuit 320 increases the delay time of the timer 330 in a monotonic manner each time step S490 is performed.

Figure 6:
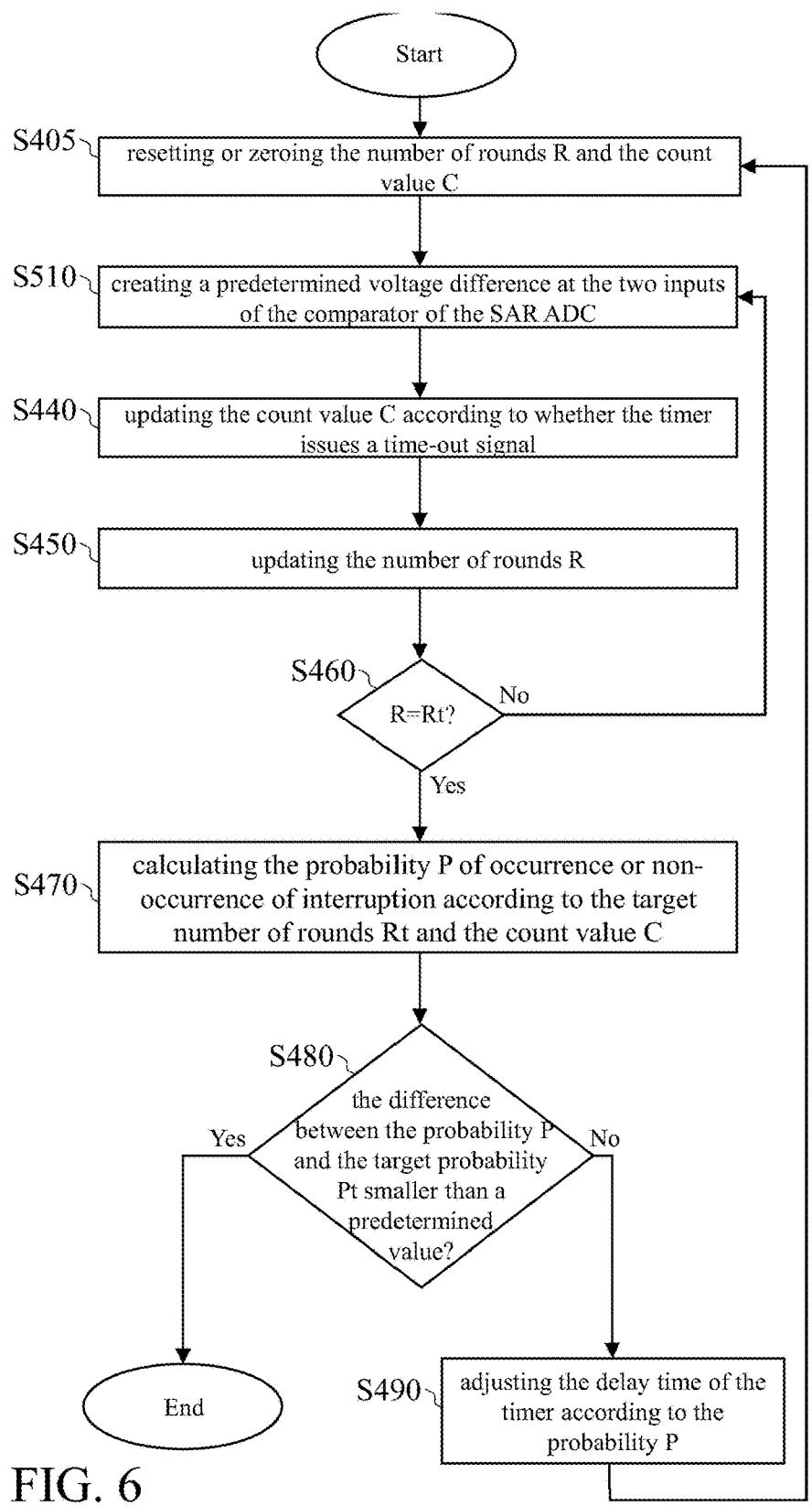
FIG. 6 illustrates a flowchart of a timer calibration method according to another embodiment of the present invention.

As discussed above, since the voltage difference between the inputs of the comparator 310 of the SAR ADC is very likely to be within $\pm V_{LSB}$ in step S430, in an alternative embodiment of the present invention, the calibration can be conducted by inputting a voltage within $\pm V_{LSB}$ to the inputs of the comparator 310. FIG. 6 is a flowchart of a timer calibration method according to another embodiment of the present invention. Most steps of the calibration process of FIG. 6 are similar or identical to those of FIG. 5, except that in step S510 the control circuit 320 creates a predetermined voltage difference Vd at the two inputs of the comparator 310 of the SAR ADC. The absolute value of the predetermined voltage difference is smaller than or equal to the absolute value of the voltage corresponding to one LSB of the SAR ADC (i.e., $-V_{LSB} \leq Vd \leq V_{LSB}$). The subsequent steps are the same as those in FIG. 5 and thus omitted for brevity. Compared to FIG. 5, the calibration process of FIG. 6 is more efficient because the time for performing step S420 can be saved.

The calibration process of FIG. 6 assumes that there is no offset between the two inputs of the comparator 310. In some embodiments, the comparator 310 is subjected to offset calibration before the calibration process of FIG. 6 is performed.

Figure 7:
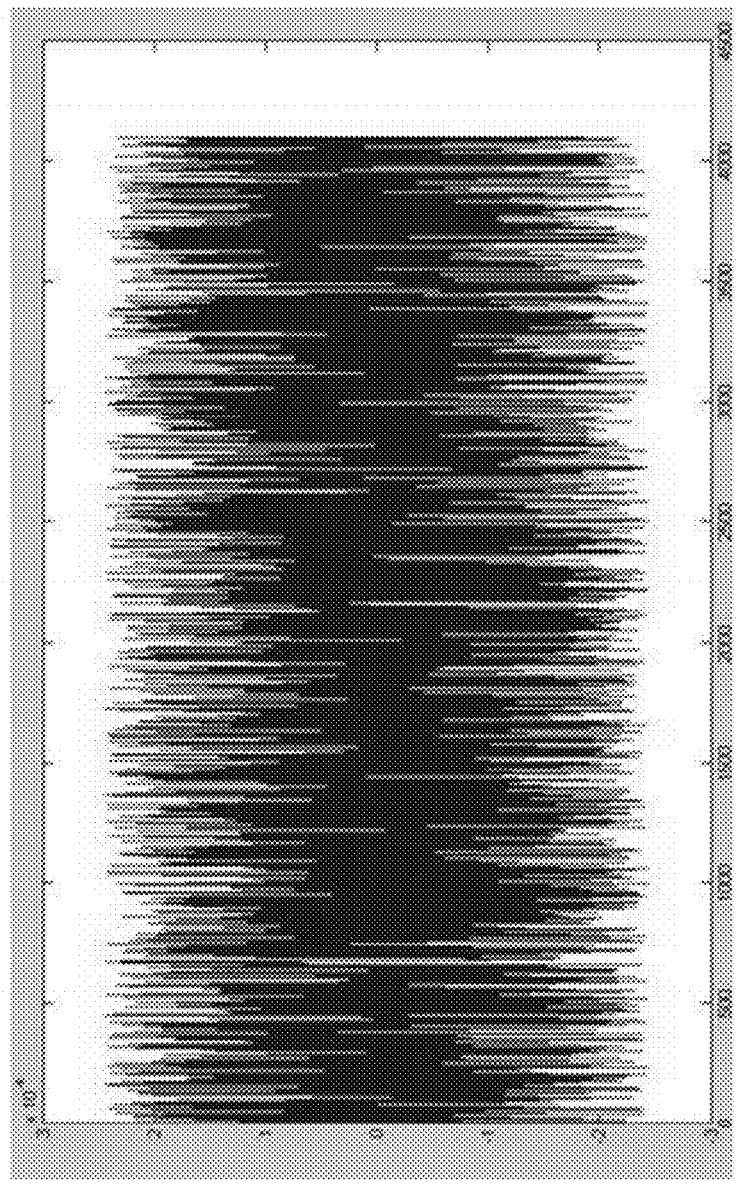
FIG. 7 illustrates the statistics of the voltage difference at the inputs of a comparator in 4096 final comparison operations of a 12-bit SAR ADC.

In some embodiments, the target probability Pt may be determined according to the correlation between the probability of occurrence or non-occurrence of time out and the magnitude of the input signal of the comparator 310. In this way, after the calibration is completed, the delay time of the timer 330 is substantially equal to the comparison time corresponding to the voltage difference at the inputs of the comparator 310 being a predetermined value. This predetermined value is, for example, the voltage corresponding to one LSB of the SAR ADC. FIG. 7 shows the statistics of the voltage difference at the inputs of a comparator in 4096 final comparison operations of a 12-bit SAR ADC (the horizontal axis is the number of times, and the vertical axis is the voltage). As can be seen from the figure, the input voltage difference falls within $\pm V_{LSB}$ ($V_{LSB}=1000$ mv/$2^{12}$=0.244 mv). The voltage difference at the inputs of the comparator corresponding to the target probability Pt can be known from FIG. 7.

Figure 1:
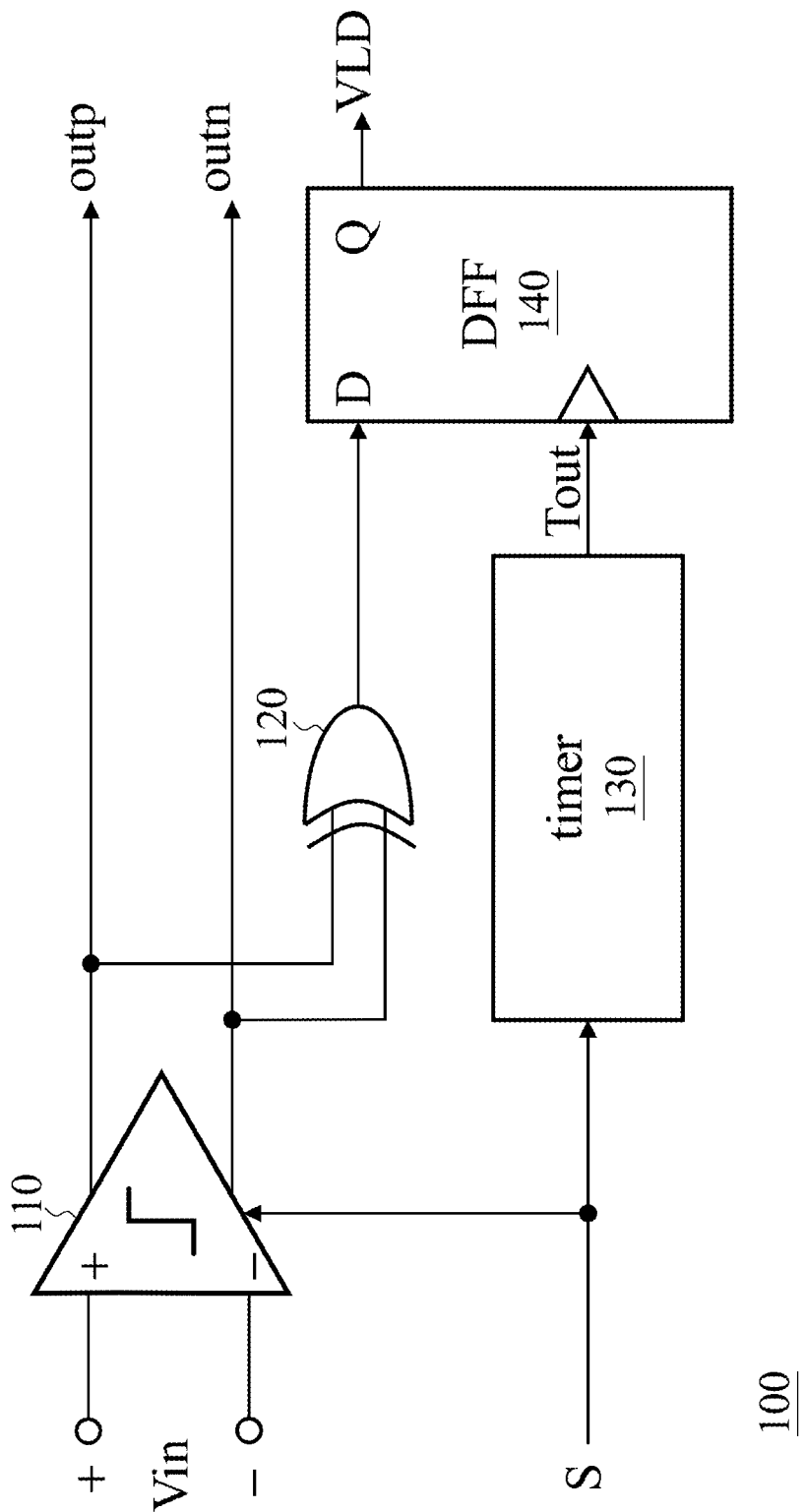
FIG. 1 illustrates a partial circuit diagram of a conventional SAR ADC.
Figure 2:
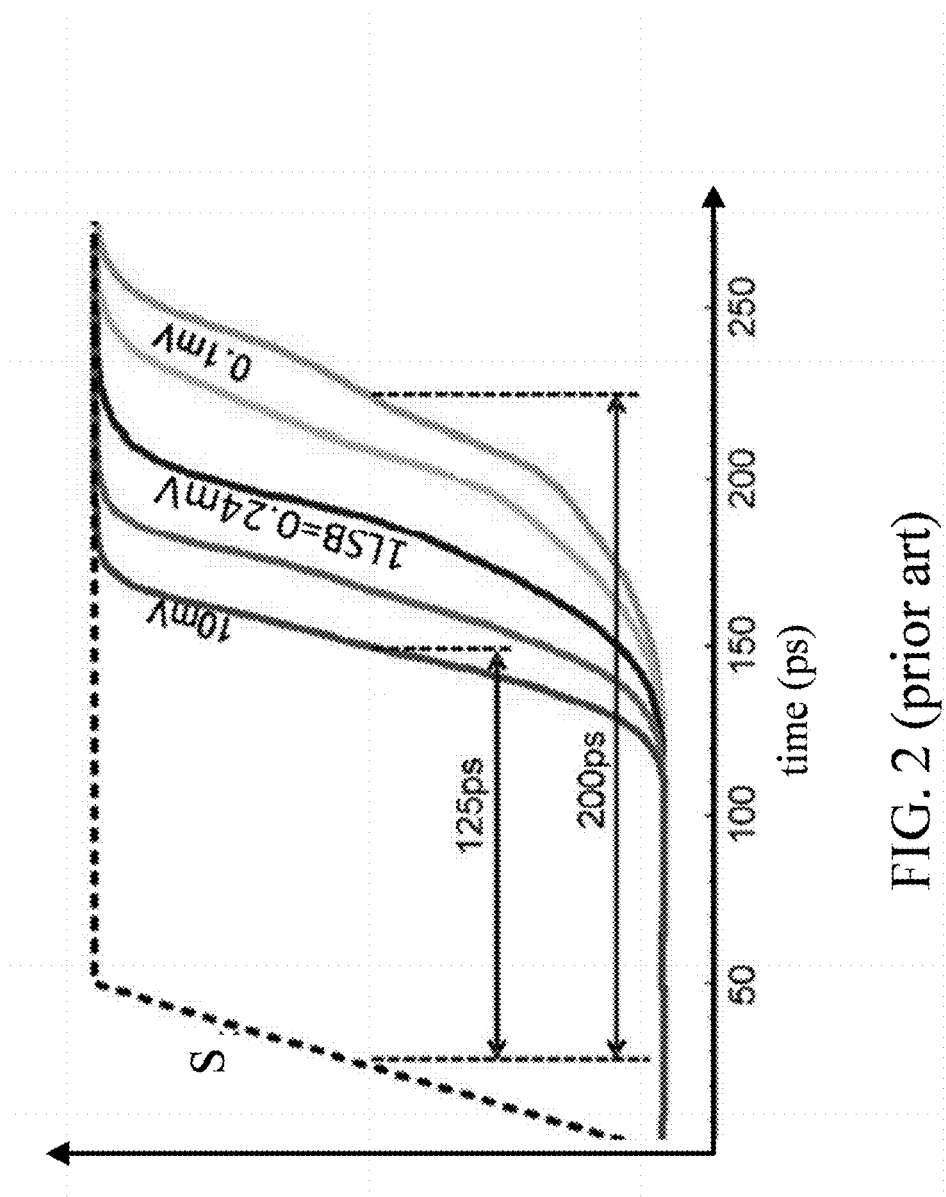
FIG. 2 illustrates a relationship between the comparison time that a comparator needs and the input voltage difference.
Figure 3A:
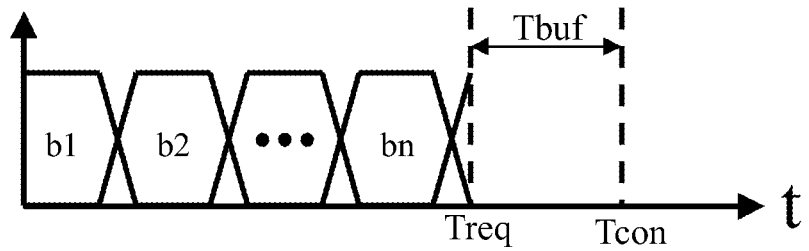
FIGS. 3A and 3B illustrate waveforms with respect to the conversion time of the SAR ADC.
Figure 3B:
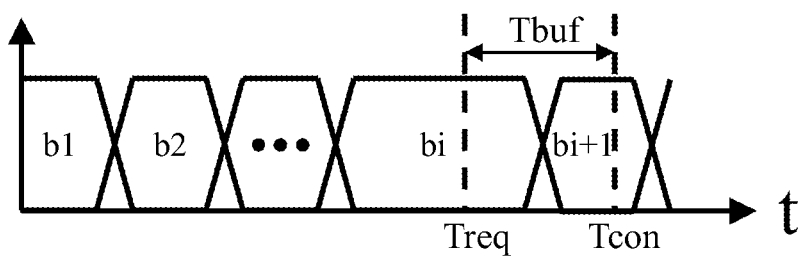

In some embodiments, the target probability Pt can be set to be proportional to the length of the buffer time interval Tbuf shown in FIGS. 3A and 3B. The length of the buffer time interval Tbuf may be, for example, 10% of the allowed time Tcon.

In some embodiments, the target probability Pt can be set to not close to zero and not greater than or closer to one, such as 0.1≤Pt≤0.9, or 0.2≤Pt≤0.9.

In some embodiments, the control circuit 320 can be a digital circuit, such as a digital signal processor (DSP), a micro controller (MCU), or a microprocessor. The memory 340 can store a plurality of codes or program instructions, and the control circuit 320 can carry out its functions by executing the codes or program instructions. The calibration method and calibration circuit of the present invention can be applied to both synchronous and asynchronous SAR ADCs.

Since a person having ordinary skill in the art can appreciate the implementation detail and the modification thereto of the present method invention through the disclosure of the device invention, repeated and redundant description is thus omitted. Please note that there is no step sequence limitation for the method inventions as long as the execution of each step is applicable. Furthermore, the shape, size, and ratio of any element and the step sequence of any flow chart in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A method for calibrating a successive approximation register analog-to-digital converter (SAR ADC), wherein before the SAR ADC generates a digital code, a comparator of the SAR ADC performs N comparison operations, and a final comparison operation of the N comparison operations corresponds to a least significant bit (LSB) of the digital code, the calibration method comprising steps of:
    (a) inputting a voltage to the SAR ADC;
    (b) turning off a timer of the SAR ADC in the first N−1 comparison operations of the N comparison operations, wherein the timer issues a time-out signal after a delay time has passed;
    (c) turning on the timer during the final comparison operation of the N comparison operations;
    (d) repeating steps (a) through (c) a predetermined number of times, and, meanwhile, updating a count value according to whether the timer issues the time-out signal;
    (e) calculating a probability according to the predetermined number of times and the count value; and
    (f) adjusting the delay time according to the probability.

2. The calibration method of claim 1, wherein the probability is a probability of issuance of the time-out signal, step (f) comprising:
    (f1) comparing the probability with a target probability;
    (f3) increasing the delay time when the probability is greater than the target probability; and
    (f3) decreasing the delay time when the probability is smaller than the target probability.

3. The calibration method of claim 2 further comprising:
    (g) repeating steps (a) through (f) a plurality of times to adjust the delay time a plurality of times;
    wherein the probability obtained in performing step (e) for the first time is equal to or close to zero, and the delay time is decreased each time step (f) is performed.

4. The calibration method of claim 2 further comprising:
    (g) repeating steps (a) through (f) a plurality of times to adjust the delay time a plurality of times;
    wherein the probability obtained in performing step (e) for the first time is equal to or close to one, and the delay time is increased each time step (f) is performed.

5. The calibration method of claim 1, wherein the probability is a probability of non-issuance of the time-out signal, step (f) comprising:
    (f1) comparing the probability with a target probability;
    (f3) decreasing the delay time when the probability is greater than the target probability; and
    (f3) increasing the delay time when the probability is smaller than the target probability.

6. The calibration method of claim 5 further comprising:
    (g) repeating steps (a) through (f) a plurality of times to adjust the delay time a plurality of times;
    wherein the probability obtained in performing step (e) for the first time is equal to or close to one, and the delay time is decreased each time step (f) is performed.

7. The calibration method of claim 5 further comprising:
    (g) repeating steps (a) through (f) a plurality of times to adjust the delay time a plurality of times;
    wherein the probability obtained in performing step (e) for the first time is equal to or close to zero, and the delay time is increased each time step (f) is performed.

8. A method for calibrating a successive approximation register analog-to-digital converter (SAR ADC), wherein the SAR ADC comprises a comparator and generates a digital code, the calibration method comprising steps of:
    (a) creating a voltage difference between two inputs of the comparator, wherein an absolute value of the voltage difference is smaller than or equal to an absolute value of a voltage corresponding to a least significant bit (LSB) of the digital code;
    (b) updating a count value according to whether a timer of the SAR ADCs issues a time-out signal, wherein the timer issues the time-out signal after a delay time has passed;
    (c) repeating steps (a) through (b) a predetermined number of times;
    (d) calculating a probability according to the predetermined number of times and the count value; and
    (e) adjusting the delay time according to the probability.

9. The calibration method of claim 8, wherein the probability is a probability of issuance of the time-out signal, step (e) comprising:
    (e1) comparing the probability with a target probability;
    (e2) increasing the delay time when the probability is greater than the target probability; and
    (e3) decreasing the delay time when the probability is smaller than the target probability.

10. The calibration method of claim 9 further comprising:
    (f) repeating steps (a) through (e) a plurality of times to adjust the delay time a plurality of times;
    wherein the probability obtained in performing step (d) for the first time is equal to or close to zero, and the delay time is decreased each time step (e) is performed.

11. The calibration method of claim 9 further comprising:
    (f) repeating steps (a) through (e) a plurality of times to adjust the delay time a plurality of times;
    wherein the probability obtained in performing step (d) for the first time is equal to or close to one, and the delay time is increased each time step (e) is performed.

12. The calibration method of claim 8, wherein the probability is a probability of non-issuance of the time-out signal, step (e) comprising:
    (e1) comparing the probability with a target probability;
    (e2) decreasing the delay time when the probability is greater than the target probability; and
    (e3) increasing the delay time when the probability is smaller than the target probability.

13. The calibration method of claim 12 further comprising:
    (f) repeating steps (a) through (e) a plurality of times to adjust the delay time a plurality of times;
    wherein the probability obtained in performing step (d) for the first time is equal to or close to one, and the delay time is decreased each time step (e) is performed.

14. The calibration method of claim 12 further comprising:
    (f) repeating steps (a) through (e) a plurality of times to adjust the delay time a plurality of times;
    wherein the probability obtained in performing step (d) for the first time is equal to or close to zero, and the delay time is increased each time step (e) is performed.

* * * * *